United States Patent [19]
Ohkubo et al.

[11] Patent Number: 5,388,116
[45] Date of Patent: Feb. 7, 1995

[54] SEMICONDUCTOR LASER DEVICE

[75] Inventors: Michio Ohkubo; Toshio Kikuta, both of Kanagawa, Japan

[73] Assignee: The Furukawa Electric Co., Ltd., Tokyo, Japan

[21] Appl. No.: 125,848

[22] Filed: Sep. 24, 1993

[30] Foreign Application Priority Data

Sep. 25, 1992 [JP] Japan ................................ 4-280640
Nov. 11, 1992 [JP] Japan ................................ 4-327474

[51] Int. Cl.⁶ ........................................... H01S 3/19
[52] U.S. Cl. ........................................ 372/45; 372/46
[58] Field of Search ................................ 372/45, 46

[56] References Cited

U.S. PATENT DOCUMENTS

| | | | |
|---|---|---|---|
| 4,899,349 | 2/1990 | Hayakawa et al. | 372/46 |
| 4,949,349 | 8/1990 | Ohba et al. | 372/45 |
| 5,023,880 | 6/1991 | Suzuki et al. | 372/45 |
| 5,095,488 | 3/1992 | Yamamoto et al. | 372/45 |

FOREIGN PATENT DOCUMENTS 0106085 4/1990 Japan ................................ 372/46

*Primary Examiner*—Georgia Y. Epps
*Attorney, Agent, or Firm*—Jacobson, Price, Holman & Stern

[57] ABSTRACT

There is provided a semiconductor laser device that can be driven for a high-output power level without degradation in the quality of the device. It comprises a double heterostructure including an active layer (5, 25) and an electrode layer (9, 29) arranged on a semiconductor substrate (1, 21) having a current injection region extending through the electrode layer (9, 29) and the active layer (5, 25), a structural scheme being provided either in a region located above the active layer (5, 25) or in a region covering an resonator of the active layer (5, 25) in order to reduce the injection current level of the device. With such an arrangement, the energy output level of the semiconductor laser device is remarkably enhanced and its reliability is greatly improved, because it can be driven for a high-output power level without degradation in the quality of the device.

14 Claims, 3 Drawing Sheets

SEMICONDUCTOR LASER DEVICE

BACKGROUND OF THE INVENTION

1. Field of Industrial Use

This invention relates to a semiconductor laser device to be suitably used for a telecommunications or optical application as it is driven with an enhanced energy output level.

2. Prior Art

There has been an increasing demand for GaAs-type semiconductor laser devices capable of being driven with a high energy output level for telecommunications and optical applications.

When a semiconductor laser device is driven to show a high-output power level, there arise problems including catastrophic optical damage at the facets of laser and corrosion, when the device is used continuously for a long period of time.

It is believed that these problems take place when the temperature of the facets of a semiconductor laser device is subjected to a repetition of the cycle of rise in the surface temperature, reduction in the band gap, light absorption and increase in the surface recombination current.

A proposed solution for these problems is the provision of a structure (window structure) that effectively prevents the phenomenon of light absorption from occurring on the facets of a semiconductor laser.

More specifically, such a structure comprises part of an active layer that can effectively expand a band gap and hence suppress light absorption and optical damage of the part of the semiconductor laser device caused by light absorption.

PROBLEM TO BE SOLVED BY THE INVENTION

With such a preventive measure as described above, however, the semiconductor laser device can also be degraded as the surface recombination current running on the device increases as a result of an electric current given rise to by a bias voltage applied to the facets of the device having a band gap expanding area and the Joule's heat generated by the current.

OBJECT OF THE INVENTION

In view of the above technological problems, it is, therefore, an object of the invention to provide a semiconductor laser that can be driven for a high-output power level without degradation in the quality of the device.

SUMMARY OF THE INVENTION

Means for Achieving the Object

According to the invention, the above object and other objects of the invention are achieved by providing a semiconductor laser device comprising double heterostructure including an active layer and an electrode layer arranged on a semiconductor substrate and having a current injection region extending through the electrode layer and the active layer, a structural scheme being provided either in a region located above the active layer or in a region covering an resonator of the active layer in order to reduce the injection current level of the device.

The structural scheme provided in a semiconductor laser device according to the invention in order to reduce the injection current level of the device is preferably selected from the three alternatives, mentioned below.

A first alternative is a Schottky junction of a metal and a semiconductor having a relatively high threshold voltage and arranged in the current injection region and close to a light reflecting facet of the region.

A second one is an insulating object arranged between the electrode layer and the active layer and close to a light reflecting facet of the current injection region.

A third alternative is a semiconductor region having a band gap greater than that of the active layer and arranged on the resonator side of the active layer and a current noninjection structure is formed on the resonator side of the active layer, including the semiconductor region.

Such a current noninjection structure may comprise a pnp-type current blocking layer. It may alternatively comprise an npn-type current blocking layer. Still alternatively, it may comprise a layer with no electrode.

Function

When a Schottky junction is formed closed to a light reflecting facet of the current injection region of a semiconductor laser device according to the invention as in the case of the first embodiment, which will be described hereinafter, the injection current density of that area can be made lower than that of the remaining area of the device.

By so reducing the injection current density of a particular area, any significant temperature rise on the light reflecting facets (in the current injection region) can be effectively prevented from occurring during current injection so that no reduction of the band gap of the device and consequent light absorption will take place.

It should be noted that such an arrangement can be easily realized in manufacturing semiconductor laser devices of the type under consideration.

The effects as described above for the first embodiment can also be achieved when, alternatively, an insulating object is arranged between the electrode layer and the active layer of a semiconductor laser device according to the invention as in the case of the second embodiment.

Again, no temperature rise is observed on the resonator facet and in its vicinity and, therefore, the injection current in those areas is reduced when, still alternatively, a semiconductor region having a band gap greater than that of the active layer and arranged on the resonator side of the active layer and a current noninjection structure is formed on the resonator side of the active layer, including the semiconductor region, as in the case of the third embodiment.

The optical output characteristics of a semiconductor laser device are remarkably improved to greatly enhance the reliability of the device when the rate of generation of Joule's heat is suppressed in the particular area of the device in a manner as described above.

The above statement holds true, regardless of the current non-injection structure being composed of a pnp-type current blocking layer, an npn-type current blocking layer or a layer with no electrode.

Now, the present invention will be described by referring to the accompanying drawings that illustrate preferred embodiments of the invention.

DETAILED DESCRIPTION OF THE PREFERRED EMBODIMENTS

Figure 1:
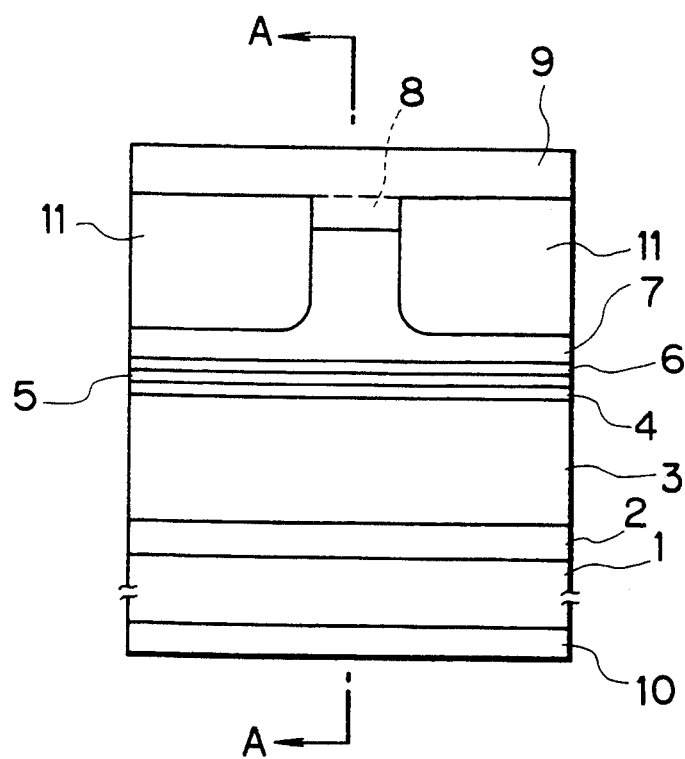
FIG. 1 is a schematic front view of a first embodiment of semiconductor laser device of the invention.
Figure 2:
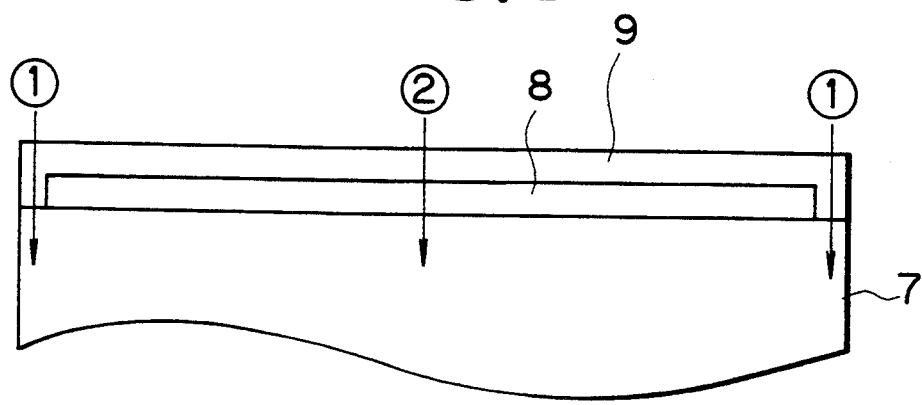
FIG. 2 is a schematic partial sectional view of the first embodiment cut along A—A line in FIG. 1.

FIGS. 1 and 2 show a first embodiment of semiconductor laser device of the invention.

Referring to FIGS. 1 and 2, the device comprises an n-GaAs substrate 1, an n-GaAs buffer layer 2, an n-InGaP lower clad layer 3, an n-GaAs lower light confinement layer 4, a p-$In_{0.2}Ga_{0.8}As$ active layer 5, a p-GaAs upper light confinement layer 6, a p-InGaP upper clad layer 7, a p+ GaAs cap layer 8, a p-electrode layer 9, an n-electrode layer 10 and a polyimide layer 11.

A semiconductor laser device as illustrated in FIGS. 1 and 2 may typically be prepared in a manner as described below.

Firstly, an n-GaAs buffer layer 2 with a thickness of 0.5 μm and $n=1 \times 10^{18}$ cm$^{-3}$, an n-InGaP lower clad layer 3 with a thickness of 1.2 μm and $n=1 \times 10^{18}$ cm$^{-3}$, an n-GaAs lower light confining layer 4 with a thickness of 0.03 μm and $n=3 \times 10^{17}$ cm$^{-3}$, a p-$In_{0.2}Ga_{0.8}As$ active layer 5 with a thickness of 80 Å and $n=3 \times 10^{17}$ cm$^{-3}$, a p-GaAs upper light confining layer 6 with a thickness of 0.03 μm and $n=3 \times 10^{17}$ cm$^{-3}$, a p-InGaP upper clad layer 7 with a thickness of 1.0 μm and $n=1 \times 10^{18}$ cm$^{-3}$ and a p+-GaAs cap layer 8 with a thickness of 0.05 μm and $n=4 \times 10^{19}$ cm$^{-3}$ are sequentially formed on an n-GaAs substrate 1 in a crystal growth process using an epitaxial growth technique.

Thereafter, a ridge mesa is formed to a ridge width of 2 μm and a cavity length of 800 μm on the n-GaAs substrate 1 in a mesa formation process using a photolithography technique.

Subsequently, a narrow etching mask is laid on the upper surface of the ridge mesa and then the cap layer 8 is removed except the masked area by photolithography.

Since the etching mask is 740 μm long and covers a middle portion of the ridge mesa having a length of 800 μm, the latter is etched at the opposite end sections by 30 μm on the light reflecting facet side.

Finally, the etched opposite end sections of the ridge mesa are filled with a polyimide layer 11 and then a Ti/Pt/Au p-electrode layer 9 and a metal n-electrode layer 10 are fitted respectively to the epitaxially grown side and the lower surface of the n-GaAs substrate 1 to produce a complete ridge waveguide type semiconductor laser device.

Note that, in the above embodiment, the titanium (Ti) constituting part of the p-electrode plate 9 is held in contact with the p-InGaP ($p=1 \times 10^{18}$ cm$^{-3}$) upper clad layer 7 at the opposite end sections of the ridge mesa while all the remaining surface areas of the titanium of the plate 9 is held in contact with the p+-GaAs($n=4 \times 10^{19}$ cm$^{-3}$) cap layer 8.

In an experiment conducted by using the above embodiment of semiconductor laser device, the current-voltage relationship was determined between the p-electrode 9 and the cap layer 8 and between the p-electrode 9 and the upper clad layer 7 by means of a known method of measurement. The results are illustrated in FIG. 3.

Figure 3:
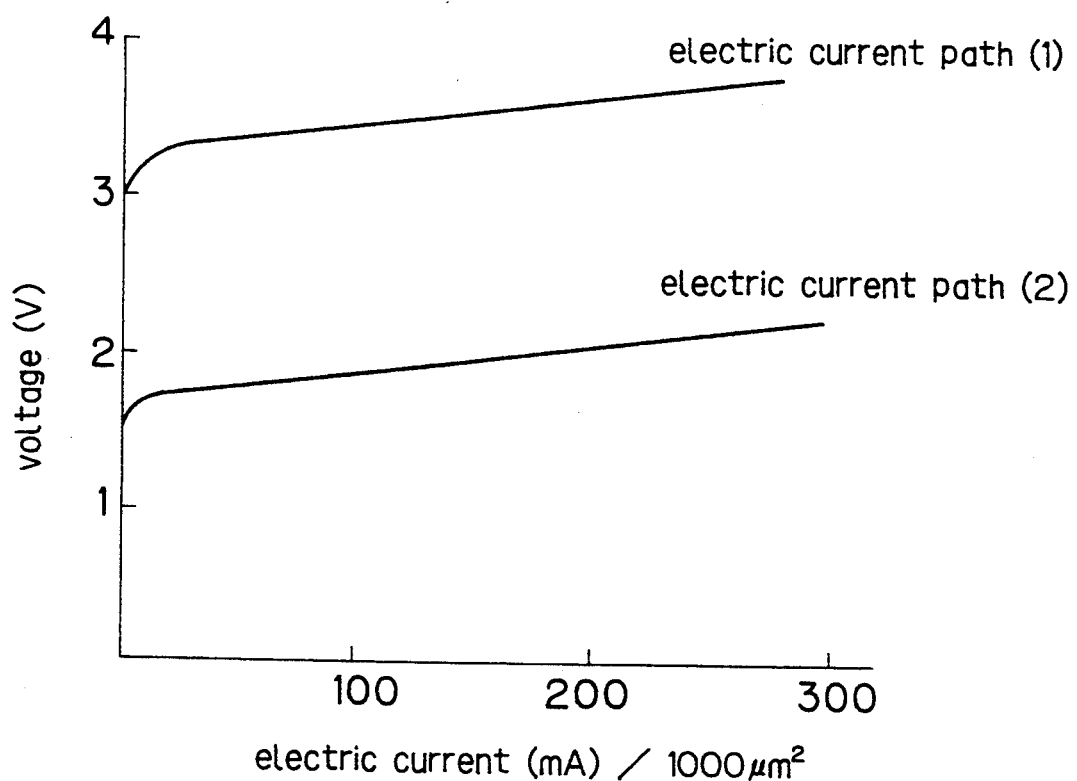
FIG. 3 is a graph showing the relationship between the electric current and the voltage at the two opposite ends of the ridge mesa and a similar relationship observed between two different points of the ridge mesa of the first embodiment of FIG. 1.

Referring to FIG. 3, it will be understood that the voltage is higher between the opposite ends of the ridge mesa (electric current path (1)) than between any two other points of the ridge mesa (electric current path (2)).

The reason for this is that a Schottky junction is formed by InGaP doped to a low concentration level and Ti as described above.

Incidentally, it should be noted that an excellent ohmic junction is formed by GaAs doped to a high concentration level and Ti.

Therefore, the embodiment (hereinafter referred to as Example 1) will show a relatively low injection current level at the opposite ends of the ridge mesa when it is driven for laser emission.

For the purpose of comparison, an unconfined current injection type semiconductor laser device having a ridge mesa with unetched opposite ends was prepared in a manner similar to that of preparing Example 1 (hereinafter referred to as Comparison Example 1).

Then, the destruction optical output at which the laser emitting surface comes to be destroyed due to temperature rise and the increase rate of the threshold current when driven at 50° C. and 100 mW for 1,000 hours were determined for both Example 1 and Comparison Example 1, as listed below.

Example 1 the destruction optical output: 400 mW
the increase rate of the threshold current: 1%

Comparison Example 1 the destruction optical output: 300 mW
the increase rate of the threshold current: 5%

Clearly, Example 1 showed a destruction optical output greater than that of Comparison Example 1 although the increase rate of the threshold current of Example 1 was not significantly lower than that of Comparison Example 1.

The destruction optical output and the increase rate of the threshold current of a substitute embodiment obtained by arranging an insulating object between the electrode layer and the active layer and close to a light reflecting facet of the current injection region showed similar results.

Now, a second embodiment of the invention will be described by referring to FIGS. 4 and 5.

Figure 4:
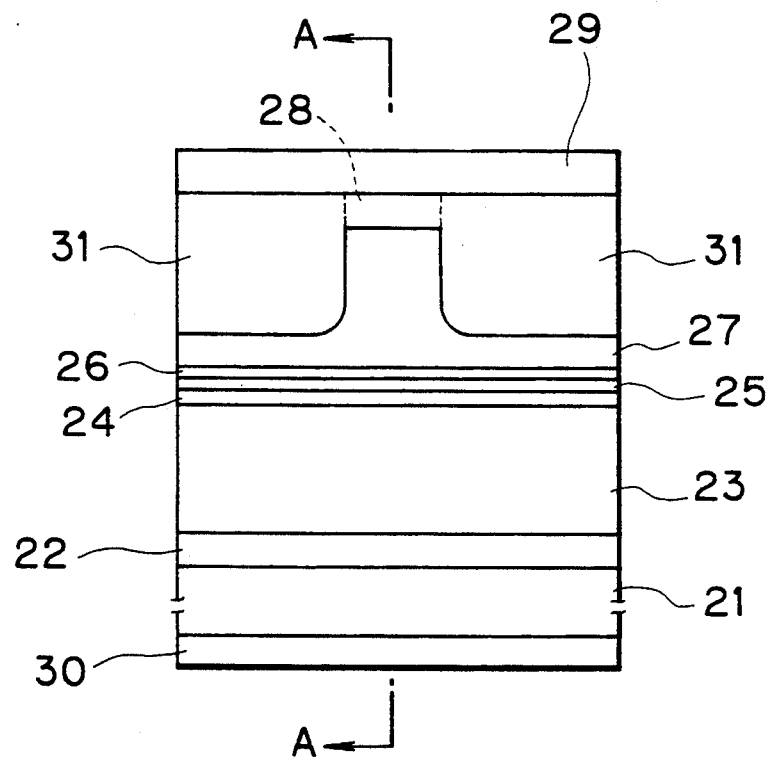
FIG. 4 is a schematic front view of a second embodiment of semiconductor laser device of the invention.
Figure 5:
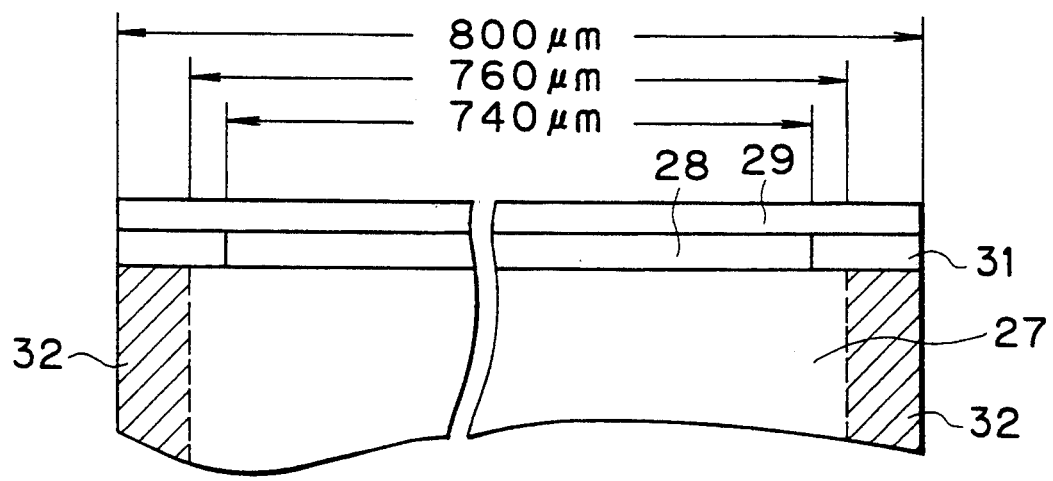
FIG. 5 is a schematic partial sectional view of the second embodiment cut along B—B line in FIG. 4.

FIGS. 4 and 5 show a second embodiment of semiconductor laser device of the invention.

Referring to FIGS. 4 and 5, the device comprises an n-GaAs substrate, 21, an n-GaAs buffer layer 22, an n-InGaP lower clad layer 23, an n-GaAs lower light confinement layer 24, a p-$In_{0.2}Ga_{0.8}As$ active layer 25, a p-GaAs upper light confinement layer 26, a p-InGaP upper clad layer 27, a p+-GaAs cap layer 28, a p-electrode layer 29, an n-electrode layer 30, a polyimide layer 31 and a pair of Zn diffusion regions 32.

A semiconductor laser device as illustrated in FIGS. 4 and 5 may typically be prepared in a manner as described below.

Firstly, an n-GaAs buffer layer 22 with a thickness of 0.5 μm and $n=1\times10^{18}$ cm$^{-3}$, an n-InGaP lower clad layer 23 with a thickness of 1.2 μm and $n=1\times10^{18}$ cm$^{-3}$, an n-GaAs lower light confinement layer 24 with a thickness of 0.03 μm and $n=3\times10^{17}$ cm$^{-3}$, a p-In$_{0.2}$Ga$_{0.8}$As active layer 25 with a thickness of 80 Å and $n=3\times10^{17}$ cm$^{-3}$, a p-GsAs upper light confinement layer 26 with a thickness of 0.03 μm and $n=3\times10^{17}$ cm$^{-3}$, a p-InGaP upper clad layer 27 with a thickness of 1.0 μm and $n=1\times10^{18}$ cm$^{-3}$ and a p$^+$-GaAs cap layer 28 with a thickness of 0.5 μm and $n=4\times10^{19}$ cm$^{-3}$ are sequentially formed on an n-GaAs substrate 1 in a crystal growth process using an epitaxial growth technique.

Thereafter, a ridge mesa is formed to a ridge width of 3 μm and a cavity length of 800 μm on the n-GaAs substrate 1 in a mesa formation process using a photolithography technique.

Subsequently, a narrow etching mask is laid on the upper surface of the ridge mesa and zinc is caused to diffuse into the unmasked regions of the ridge mesa to form a pair of Zn diffusion regions 32 arranged at the respective opposite ends of the ridge mesa also by using a photolithography technique.

Since the etching mask is 760 μm long and covers a middle portion of the ridge mesa having a length of 800 μm, each of the Zn diffusion regions 32 has a length of 20 μm as shown in FIG. 5.

As the Zn diffusion regions 32 are formed, the portions of the active layer that are composed of a quantum well layer are caused to show disordering. Then, the band gap of the disordering of the active layer 25 will be expanded relative to that of the remaining portions to show a so-called window structure.

Then, another narrow etching mask is laid on the upper surface of the ridge mesa and the cap layer 28 is removed except the masked area again by photolithography.

Since the etching mask is 740 μm long and covers a middle portion of the ridge mesa having a length of 800 μm, the latter is etched at the opposite end sections by 30 μm on the light reflecting facet side as shown in FIG. 5.

Thereafter, the etched opposite end sections of the ridge mesa are filled with a polyimide layer 31 to form a current noninjection structure.

Finally, a Ti/Pt/Au p-electrode layer 29 and a metal n-electrode layer 30 are fitted, respectively to the epitaxially grown side and the lower surface of the n-GaAs substrate 1 to produce a complete ridge waveguide type semiconductor laser device.

Note that the above embodiment (hereinafter referred to as Example 2) has a cavity length of 800 μm and the portions of the active layer 25 located at the opposite ends and each having a length of 20 μm show a window structure where the band gap is greater than that of the remaining portions of the active layer 29, while each of the opposite end portions of the ridge mesa presents a current noninjection structure for a length of 30 μm.

In an experiment conducted by using Example 2, a semiconductor laser device provided with a window structure but devoid of a current noninjection structure (hereinafter referred to as Comparison Example 2) and a semiconductor laser device having neither a window structure nor a current noninjection structure (hereinafter referred to as Comparison Example 3) were prepared in a manner similar to that of preparing Example 2.

Then, the destruction optical output at which the laser emitting surface comes to be destructed due to temperature rise and the increase rate of the threshold current when driven with an APC of 100 mW for 100 hours were determined for Example 2 as well as for Comparison Examples 2 and 3, as listed below.

Example 2 the destruction optical output: 500 mW
the increase rate of the threshold current: $<0.9\%$ Comparison Example 2 the destruction optical output: 400 mW
the increase rate of the threshold current: 1%

Comparison Example 3 the destruction optical output: 300 mW
the increase rate of the threshold current: 5%

Clearly, Example 2 showed a destruction optical output greater than those of Comparison Examples 2 and 3 although the increase rate of the threshold current of Example 2 was not significantly lower than those of Comparison Examples 2 and 3.

The reason for this is that the semiconductor laser device of Example 2 has both a window structure and a current noninjection structure that can effectively suppress the degradation of the laser emitting surface of the device.

The destruction optical output and the increase rate of the threshold current of a substitute embodiment obtained by arranging a pnp or npn current blocking layer for the current noninjection structure and another substitute embodiment obtained by arranging a void electrode section for the current noninjection structure showed similar improvements.

Advantages of the Invention

A semiconductor laser device according to the invention comprises a double heterostructure including an active layer and an electrode layer arranged on a semiconductor substrate and has a current injection region extending through the electrode layer and the active layer. Additionally, a structural scheme is provided either in a region located above the active layer or in a region covering an resonator of the active layer in order to reduce the injection current level of the device. With such an arrangement, the output power level of the semiconductor laser device is remarkably enhanced and its reliability is greatly improved.

A semiconductor laser device provided with a structural scheme in a region covering the resonator of the active layer of the device is particularly advantageous as such a device can be prepared easily and economically.

What is claimed is:

1. A semiconductor laser device comprising a plurality of layers including an active layer and an electrode layer arranged on a semiconductor substrate to form a double heterostructure and having a current injection region extending through electrode layer and the active layer, a structural scheme being provided in a region located above the active layer in order to reduce the injection current level of the device.

2. A semiconductor laser device according to claim 1, wherein a Schottky junction of a metal and a semiconductor having a relatively high threshold voltage is formed at a position close to a light reflecting surface of the region in the current injection region.

3. A semiconductor laser device according to claim 1, wherein an insulating object is arranged close to a light reflecting surface of the current injection region between the electrode layer and the active layer.

4. A semiconductor laser device according to claim 1, wherein a semiconductor region having a band gap greater than that of the active layer is arranged on the resonator side of the active layer and a current noninjection structure is formed on the resonator side of the active layer including the semiconductor region.

5. A semiconductor laser device according to claim 4, wherein the current noninjection structure comprises a pnp-type current blocking layer.

6. A semiconductor laser device according to claim 4, wherein the current noninjection structure comprises an npn-type current blocking layer.

7. A semiconductor laser device according to claim 4, wherein the current noninjection structure comprises a void electrode layer.

8. A semiconductor laser device comprising a plurality of layers including an active layer and an electrode layer arranged on a semiconductor substrate to form a double heterostructure and having a current injection region extending through electrode layer and the active layer, a structural scheme being provided in a region covering a resonator of the active layer in order to reduce the injection current level of the device.

9. A semiconductor laser device according to claim 8, wherein a Schottky junction of a metal and a semiconductor having a relatively high threshold voltage is formed at a position close to a light reflecting surface of the region in the current injection region.

10. A semiconductor laser device according to claim 8, wherein an insulating object is arranged close to a light reflecting surface of the current injection region between the electrode layer and the active layer.

11. A semiconductor laser device according to claim 8, wherein a semiconductor region having a band gap greater than that of the active layer is arranged on the resonator side of the active layer and a current noninjection structure is formed on the resonator side of the active layer including the semiconductor region.

12. A semiconductor laser device according to claim 11, wherein the current noninjection structure comprises a npn-type current blocking layer.

13. A semiconductor laser device according to claim 11, wherein the current noninjection structure comprises an pnp-type current blocking layer.

14. A semiconductor laser device according to claim 11, wherein the current noninjection structure comprises a void electrode layer.

* * * * *